United States Patent
Makarem et al.

(10) Patent No.: US 7,379,008 B2
(45) Date of Patent: *May 27, 2008

(54) TWO-BIT OFFSET CANCELLING A/D CONVERTER WITH IMPROVED COMMON MODE REJECTION AND THRESHOLD SENSITIVITY

(75) Inventors: Rabih Makarem, Irvine, CA (US); Kwai-Kwong K. Lam, Rancho Santa Margarita, CA (US)

(73) Assignee: Atheros Technology Ltd., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/611,276

(22) Filed: Dec. 15, 2006

(65) Prior Publication Data

US 2007/0080839 A1    Apr. 12, 2007

Related U.S. Application Data

(63) Continuation of application No. 11/271,729, filed on Nov. 10, 2005, now Pat. No. 7,170,437.

(51) Int. Cl.
*H03M 1/12* (2006.01)
(52) U.S. Cl. .......................................... 341/155; 326/80
(58) Field of Classification Search ................ 341/155, 341/120, 118; 326/80
See application file for complete search history.

(56) References Cited

U.S. PATENT DOCUMENTS

| | | | |
|---|---|---|---|
| 4,853,880 A | 8/1989 | Akamatsu et al. | |
| 6,339,355 B1 * | 1/2002 | Yamauchi et al. | 327/307 |
| 6,351,506 B1 | 2/2002 | Lewicki | |
| 6,380,799 B1 | 4/2002 | Chung et al. | |
| 6,526,322 B1 | 2/2003 | Peng et al. | |
| 6,538,594 B1 | 3/2003 | Somayajula | |
| 6,803,870 B2 | 10/2004 | Kuttner | |
| 7,072,427 B2 | 7/2006 | Rawlins et al. | |
| 7,170,437 B2 * | 1/2007 | Makarem et al. | 341/155 |

FOREIGN PATENT DOCUMENTS

EP        0 338 655        1/1989

OTHER PUBLICATIONS

F. Kaess et al., "High-Speed GaAs Comparators for Low-Power 8-bit ADCs", 1998 IEEE, pp. WT11-4.1-WT11-4.4.
H. Elwan et al., "CMOS low power baseband chain for a GSM/DECT multistandard receiver", IEE Proc.-Circuits Devices Syst., vol. 149, No. 516, pp. 337-347, Oct./Dec. 2002.
Shang-Ching Dong et al., 10 Bit, 25MHz, 15mW CMOS Pipelined Subranging ADC, IEEE International Symposium on Circuits and Systems, Jun. 9-12, 1997, pp. 2024-2027.

* cited by examiner

*Primary Examiner*—Peguy JeanPierre
(74) *Attorney, Agent, or Firm*—Gates & Cooper LLP

(57) ABSTRACT

A two-bit offset canceling A/D converter with improved common mode rejection and threshold sensitivity for use in GPS receivers. A device in accordance with the present invention comprises a level shifter, the level shifter receiving a positive signal and a negative signal, the level shifter shifting the positive signal and the negative signal such that a difference between the positive signal and the negative signal is larger than a threshold value, and a comparator, coupled to the level shifter, the comparator providing as outputs of the comparators a sign bit and two magnitude bits wherein the comparator comprises a plurality of switched capacitor amplifiers.

20 Claims, 3 Drawing Sheets

TWO-BIT OFFSET CANCELLING A/D CONVERTER WITH IMPROVED COMMON MODE REJECTION AND THRESHOLD SENSITIVITY

CROSS-REFERENCE TO RELATED APPLICATIONS

This application claims the benefit under 35 U.S.C. Section 119(e) of co-pending and commonly-assigned U.S. provisional patent application, Ser. No. 60/627,595, filed Nov. 12, 2004, entitled "RF CHIP FOR GLOBAL POSITIONING SYSTEM RECEIVER," by Lloyd Jian-Le Jiang et al., which application is incorporated by reference herein.

BACKGROUND OF THE INVENTION

1. Field of the Invention

The present invention relates generally to Global Positioning System (GPS) receivers, and in particular, to a two-bit offset canceling Analog-to-Digital (A/D) converter with improved common mode rejection and threshold sensitivity, typically used in GPS receivers.

2. Description of the Related Art

The use of GPS in consumer products has become commonplace. Hand-held devices used for mountaineering, automobile navigation systems, and GPS for use with cellular telephones are just a few examples of consumer products using GPS technology.

As GPS technology is being combined with these devices, the GPS chips are being placed in widely ranging applications. Some of these applications require that the GPS chip be made smaller, or more efficient, presenting challenges to GPS receiver chip designers. Many of the functions of GPS chips are now being pushed to the edges of performance capabilities.

One of these functions is the ability to separate a GPS signal from background noise. Noise is often interpreted as a component of the GPS signal, and, as such, creates problems with position determination and accuracy of the GPS functionality. As GPS chips are placed in lower signal strength environments, and GPS chips are designed to be placed in smaller and smaller devices, the ability of a GPS receiver to separate signal from noise becomes more important.

It can be seen, then, that there is a need in the art to provide GPS chips with increased ability to separate noise from desired GPS signals.

SUMMARY OF THE INVENTION

To minimize the limitations in the prior art, and to minimize other limitations that will become apparent upon reading and understanding the present specification, the present invention discloses a two-bit offset canceling A/D converter with improved common mode rejection and threshold sensitivity for use in GPS receivers.

A device in accordance with the present invention comprises a level shifter which receives a positive and a negative signal, and three switched capacitor comparators that accept the level shifted outputs and generate one sign, and two magnitude bits. The level shifter generates four signals, two of the output signals correspond directly to the level shifted inputs, while the other two outputs are further shifted by an amount larger than or equal to the ADC threshold value.

Such a device optionally level shifts by approximately twice the threshold value, with the level shifter creating the difference using a voltage drop across a resistor.

A Global Positioning System (GPS) Receiver in accordance with the present invention comprises a radio frequency (RF) section with an integrated analog-to-digital converter, and a baseband section. The baseband section receives the outputs of the ADC.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, embodiments of the present invention. It is understood that other embodiments may be utilized and structural changes may be made without departing from the scope of the present invention.

Overview

The analog inputs to an Analog-to Digital Converter (ADC) are noisy. This includes actual signal input and reference threshold voltages. The ADC performs comparisons between the input signal and fixed thresholds to determine the digital output. If the threshold voltage is noisy, or if the comparator has offsets, then the ADC output will be in error.

Figure 1:
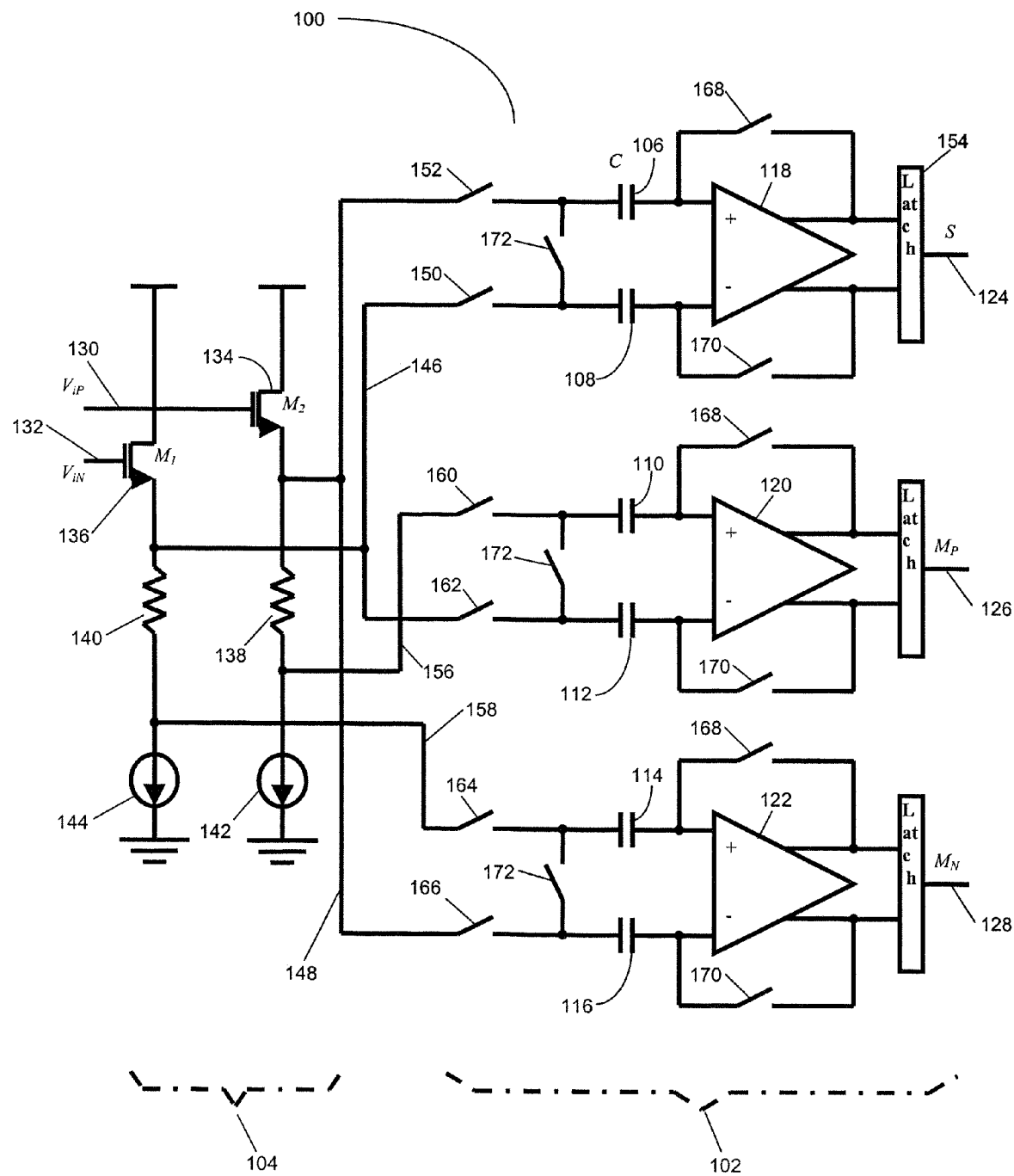
FIG. 1 illustrates a block diagram of the present invention.

FIG. 1 illustrates a block diagram of the present invention.

System 100 is shown, comprising comparator section 102 and level shifting section 104. Comparator section 102 uses capacitors 106-116 and comparators 118-122 to generate a stored offset output 124, a positive output 126, and a negative output 128.

Section 104 receives the input signals, positive input 130 and negative input 132, which are typically a differential signal, but can be separate signals if desired. Positive input 130 is applied to the gate of transistor 134, and negative input 132 is applied to the gate of transistor 136. The source of transistor 134 is coupled to resistor 138, and the source of transistor 136 is coupled to resistor 140. The other end of resistor 138 is coupled to a current source 142, and the other end of resistor 140 is coupled to a current source 144. Although shown as n-type Metal-Oxide-Semiconductor Field Effect Transistors (MOSFETs), transistors 134 and 136 can be bipolar junction transistors, p-type MOSFETs, or other types of transistors as desired, without departing from the scope of the present invention. The signals 130 and 132 would be applied in such situations to the control input to such transistors, e.g., the base of a bipolar transistor, etc.

Resistor 138 and 140 values are chosen to allow the voltage drops across resistors 138 and 140 to be larger than a threshold voltage value, and typically twice the threshold voltage needed, such that there will be a positive turn-on or turn-off of the system 100. Further, any noise present on signals 130 and 132, and current sources 142 and 144 will be canceled because the common noise will be filtered out as described herein. Current sources 142 and 144 are generated from the threshold voltage reference, and hence will have the same noise as the threshold voltage.

As such, present at point 146 is the voltage at the source of transistor 136, and present at point 148 is the voltage at source of transistor 134. These two voltages are applied to switches 150 and 152, respectively, and, during the sampling phase (switches 150, 152,168, and 170 are closed, and switch 172 is open), capacitors 106 and 108 receive signals present at points 148 and 146, respectively. These signals, 146 (Vin Negative signal 132) and 148 (Vin positive signal 130) charge capacitors 108 and 106 respectively. In addition, capacitors 108 and 106 will also store the voltage offset associated with the comparator 1 18. During the comparison phase (switches 150, 152,168, and 170 are open, and switch 172 is closed) capacitors 108 and 106 hold the signal and voltage offset associated with comparator 118. During this phase, the two input signals are compared while the offset associated with the comparator is nulled out. This action causes the signals to be compared without being degraded by comparator input offset voltage. The degree of offset cancellation depends on the open loop gain of amplifier 118 and the size of the capacitors 106 and 108, and the speed of switches 150, 152, 168, 170, and 172. Improving the performance requires increased area and/or power consumption. When the differential comparator 118 is coupled to latch 154, it generates output signal 124. Generating signals 126 and 128 uses the same switch action used to generate signal 124 as just described above.

Figure 2:
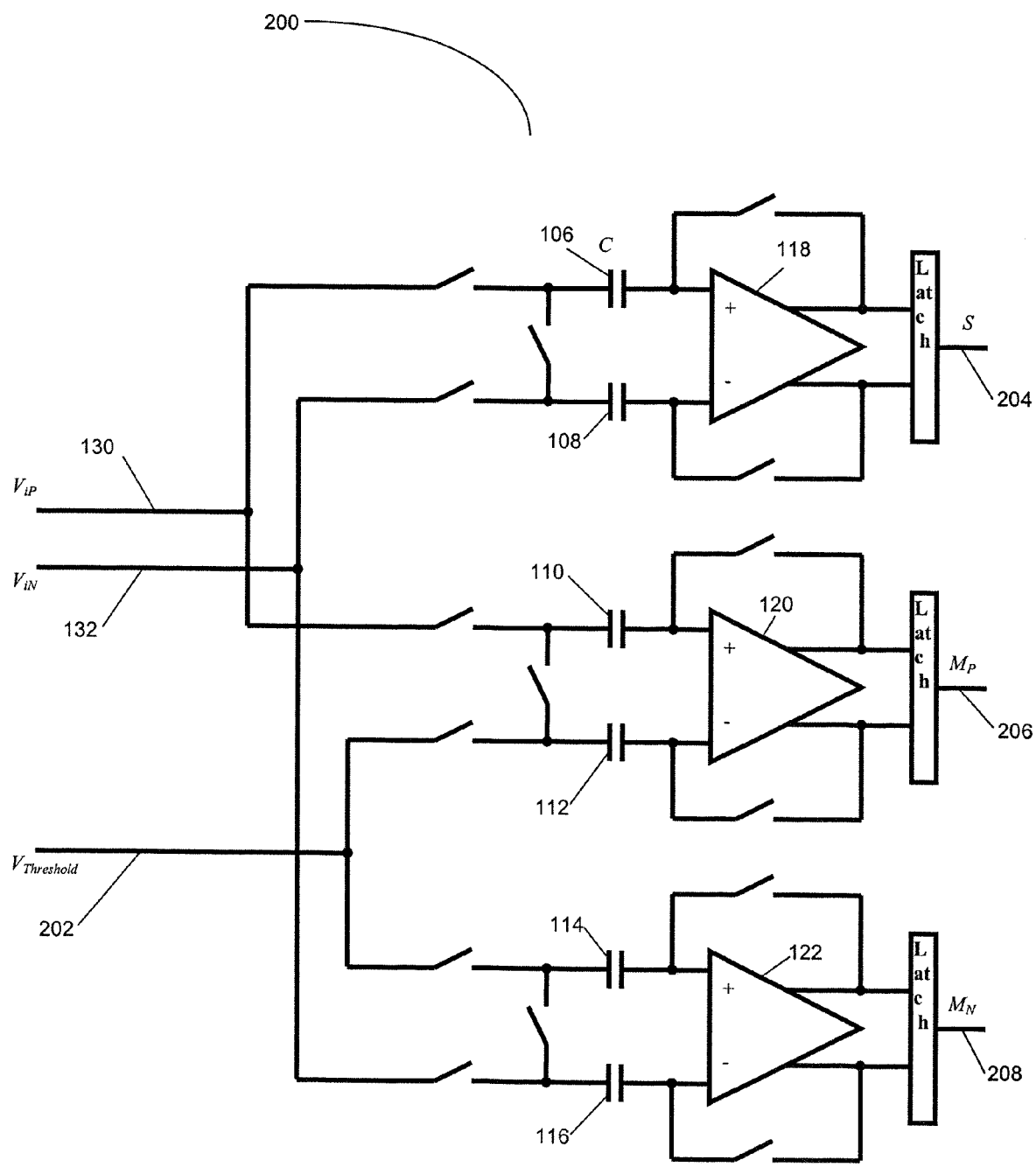
FIG. 2 illustrates the prior.

FIG. 2 illustrates the related art and shows that to generate signals 206 and 208 (the equivalents of signals 126 and 128 in FIG. 1), comparators 120 and 122 compare differential signals 130 and 132 against the threshold voltage reference, signal 202. Since the noise associated with the differential input signals can be of a different nature compared to the noise of the threshold reference, the differential nature of comparators 120 and 122 will not cancel out any noise. i.e. the noise associated with both the differential inputs 130 and 132, and reference 202, will show in output signals 206 and 208.

In the current invention as shown in FIG. 1, comparators 120 and 122 do not do a direct comparison of the input signals 130 and 132 to the threshold voltage. Instead, comparators 120 and 122 always compare the differential input signals to each other, but including a level shift. Comparator 120 compares a replica of the positive input signal to a level shifted replica of the negative input signal. The replicas are generated using similar source followers (134, and 136), resistors (138 and 140), and current sources (142 and 144). Hence all noises associated with devices 134-144 appears as common mode to the comparator 120, and similarly for comparator 122. Thus, all noise appearing as common mode is severely reduced by the common mode action of the differential comparators. In addition, if the level shifting is by more than one threshold level, the offset voltage requirements of comparators 120 and 122 are reduced, making the comparator design smaller and more power efficient. In the circuit of FIG. 1, the level shifting done in section 104 can be greater than or equal to one threshold value, and typically twice that value.

Application of Converter

Figure 3:
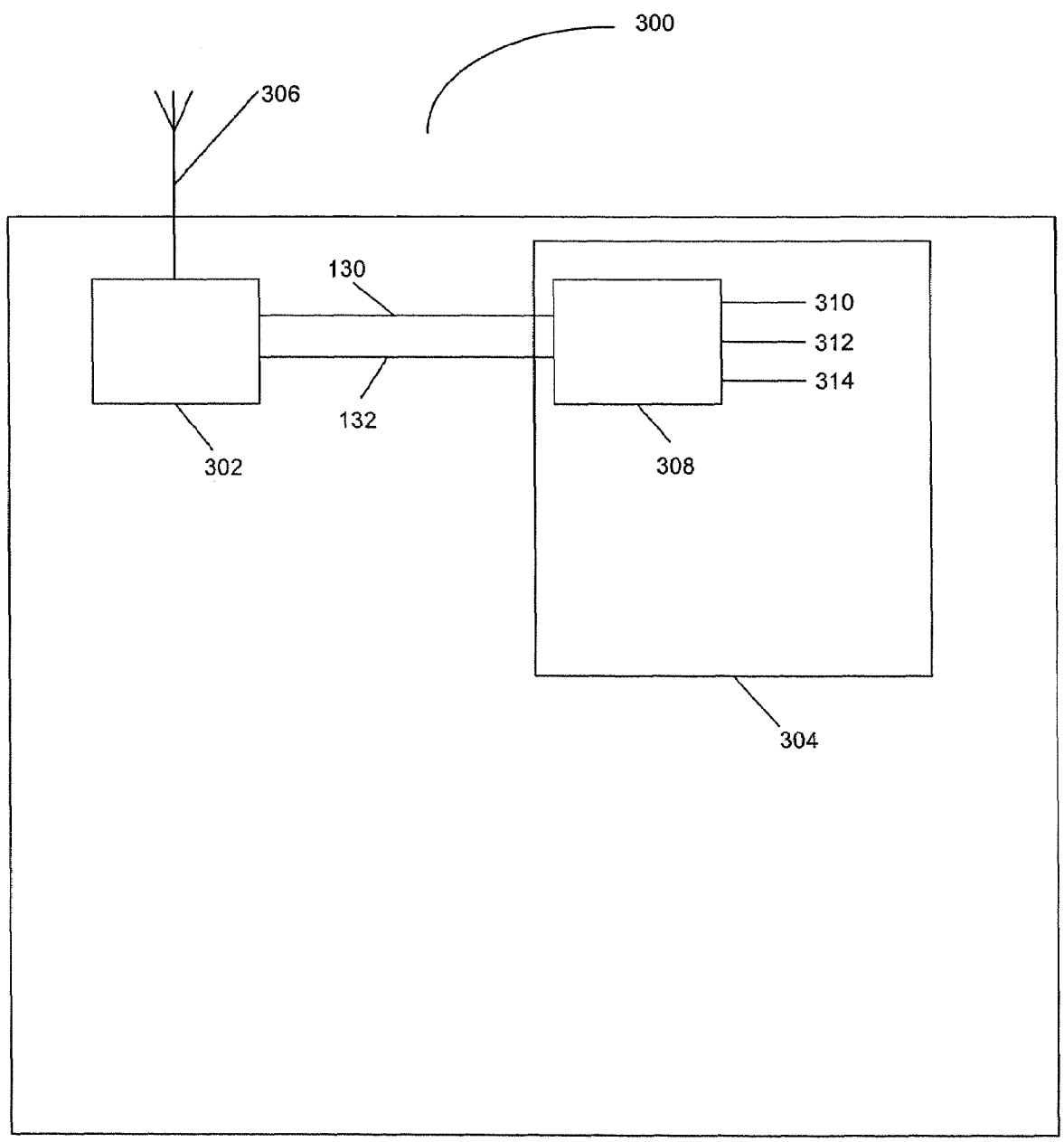
FIG. 3 illustrates a GPS receiver showing an embodiment of implementation for the present invention.

FIG. 3 illustrates a GPS receiver showing an embodiment of implementation for the present invention.

Receiver 300 shows Radio Frequency (RF) section 302, baseband section 304, and antenna 306. Antenna 306 receives GPS signals from the constellation of GPS satellites, and RF section 302 receives and initially processes these signals. Some of the outputs of RF section 302 include signals 130 and 132. Device 308, which can be system 100, or another embodiment of the present invention, is shown resident in baseband section 304, but also can be a separate device or resident within RF section 302, receives signals 130 and 132 as described with respect to FIG. 1, and generates signals 310-314. Signal 310 is signal 124 or 204, or another similar signal, depending on which embodiment of the present invention is used in device 308. Signal 312 is signal 126 or 206, or another similar signal, depending on which embodiment of the present invention is used in device 308. Similarly, signal 314 is signal 126. Device 308 can be used elsewhere in GPS receiver 300 if desired, the use of device 308 of the present invention shown in FIG. 3 is illustrative and not limiting of the usage of the device 308 of the present invention.

CONCLUSION

In summary, a device in accordance with the present invention comprises a device for converting analog signals to digital signals. A device in accordance with the present invention comprises a level shifter, the level shifter receiving a positive signal and a negative signal, the level shifter shifting the positive signal and the negative signal such that a difference between the positive signal and the negative signal is larger than or equal to a threshold value, and a comparator, coupled to the level shifter, the comparator providing as outputs of the comparator a first bit, a second bit, and an offset between the positive signal and the negative signal, wherein the comparator comprises a plurality of switched capacitor amplifiers. The action of this device is such that the noise on the threshold voltage is cancelled out, and the offset voltage specification on two of the three comparators is relaxed, resulting in area and power saving.

Such a device further optionally includes the difference being approximately twice the threshold value, the level shifter creating the difference using a voltage drop across a resistor, the positive signal and the negative signal being applied to a control input of first transistor and a control input of a second transistor in a respective fashion, and the device being used in a GPS receiver.

A Global Positioning System (GPS) Receiver in accordance with the present invention comprises a radio frequency (RF) section, a baseband section, and an analog-to-digital converter, receiving a positive signal and a negative signal, the analog-to-digital converter comprising a comparator, the comparator providing as outputs of the comparator a first bit, a second bit, and an offset between the positive signal and the negative signal.

Such a GPS receiver further optionally includes a level shifter, coupled to the comparator, the level shifter receiving the positive signal and the negative signal and shifting the positive signal and the negative signal such that a difference between the positive signal and the negative signal is larger than a threshold value; and forwarding the shifted positive signal and the shifted negative signal to the comparator, the positive signal and the negative signal being applied to a control input of first transistor and a control input of a second transistor in a respective fashion, the first transistor and the second transistor being Metal-Oxide-Semiconductor (MOS) transistors, the analog-to-digital converter is resident in the baseband section, the comparator comprising a plurality of switched capacitor amplifiers, and the difference being approximately twice the threshold value.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but by the claims appended hereto and the equivalents thereof.

What is claimed is:

1. A device for converting analog signals to digital signals, comprising:
    a level shifter, the level shifter generating a difference between a first signal and a second signal such that the difference is larger than a threshold value; and
    a comparator, coupled to the level shifter, wherein outputs of the comparator comprise at least a sign bit and two magnitude bits.

2. The device of claim 1, wherein the comparator comprises a plurality of switched capacitor amplifiers.

3. The device of claim 1, wherein the difference is approximately twice the threshold value.

4. The device of claim 3, wherein the level shifter creates the difference using a voltage drop across a resistor.

5. The device of claim 1, wherein the first signal and the second signal are applied to a control input of first transistor and a control input of a second transistor in a respective fashion.

6. The device of claim 1, wherein the device is used in a GPS receiver.

7. The device of claim 6, wherein the device is used in an RF section of the GPS receiver.

8. The device of claim 1, wherein the first signal is compared directly to the threshold voltage and the second signal is compared directly to the threshold voltage, such that noise on the threshold voltage is canceled out.

9. A Global Positioning System (GPS) Receiver, comprising:
    a radio frequency (RF) section; and
    a baseband section, coupled to the RF section, wherein the GPS receiver further comprises a comparaor having outputs including a first bit, a second bit, and an offset between a first signal and a second signal.

10. The GPS receiver of claim 9, further comprising a level shifter, coupled to the comparator, the level shifter receiving the first signal and the second signal and shifting the first signal and the second signal such that a difference between the first signal and the second signal is larger than a threshold value; and forwarding the shifted positive signal and the shifted negative signal to the comparator.

11. The GPS receiver of claim 9, wherein the first signal and the second signal are applied to a control input of a first transistor and a control input of a second transistor in a respective fashion.

12. The GPS receiver of claim 11, wherein the first transistor and the second transistor are Meral-Oxide-Semiconducror (MOS) transistors.

13. The GPS receiver of claim 9, further comprising an analog-to-digital converter resident in the GPS receiver.

14. The GPS receiver of claim 9, wherein the comparator comprises a plurality of switched capacitor amplifiers.

15. The GPS receiver of claim 9, wherein a difference between the first signal and the second signal is approximately twice the threshold value.

16. A noise-cancelling analog-to-digital converter, comprising:
    a level shifter, the level shifter generating a difference between a first signal and a second signal such that the difference is larger than a threshold value; and
    a comparator, coupled to the level shifter, the comparator determining a magnitude of the first signal by comparing a level shifted first signal against the second signal and a level shifted second signal against the first signal, wherein noise conunon to the first signal and the second signal is cancelled by the comparator.

17. The noise-cancelling analog-to-digital converter of claim 16, wherein a difference between the first signal and the second signal is approximately twice the threshold value.

18. The noise-cancelling analog-to-digital converter of claim 16, wherein the noise-cancelling analog-to-digital converter is used in a GPS receiver.

19. The noise-cancelling analog-to-digital converter of claim 16, wherein the level shifter creates the difference using a voltage drop across a resistor.

20. The noise-cancelling analog-to-digital converter of claim 16, wherein the comparator comprises a plurality of switched capacitor amplifiers.

* * * * *